(12) United States Patent
Midorikawa

(10) Patent No.: US 10,957,385 B2
(45) Date of Patent: Mar. 23, 2021

(54) SEMICONDUCTOR STORAGE DEVICE WITH ASSIST TIMING CONTROL CIRCUIT

(71) Applicants: Kabushiki Kaisha Toshiba, Tokyo (JP); Toshiba Electronic Devices & Storage Corporation, Tokyo (JP)

(72) Inventor: Tsuyoshi Midorikawa, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/555,805

(22) Filed: Aug. 29, 2019

(65) Prior Publication Data
US 2020/0294579 A1 Sep. 17, 2020

(30) Foreign Application Priority Data
Mar. 14, 2019 (JP) ............................ JP2019-047497

(51) Int. Cl.
*G11C 11/419* (2006.01)
*G11C 11/417* (2006.01)
*G11C 11/418* (2006.01)

(52) U.S. Cl.
CPC .......... *G11C 11/417* (2013.01); *G11C 11/418* (2013.01); *G11C 11/419* (2013.01)

(58) Field of Classification Search
CPC .... G11C 11/417; G11C 11/418; G11C 11/419
See application file for complete search history.

(56) References Cited

U.S. PATENT DOCUMENTS

| 8,908,418 B2 | 12/2014 | Yabuuchi |
| 2013/0100730 A1* | 4/2013 | Chang ...................... G11C 8/08 365/154 |
| 2014/0036578 A1 | 2/2014 | Jung et al. |
| 2017/0372793 A1* | 12/2017 | Walker .................. G11C 29/46 |
| 2018/0240514 A1* | 8/2018 | Yabuuchi .............. G11C 11/419 |
| 2020/0082877 A1 | 3/2020 | Midorikawa |

FOREIGN PATENT DOCUMENTS

| JP | 2014-157647 A | 8/2014 |
| JP | 2015-032338 A | 2/2015 |
| JP | 5777991 B2 | 9/2015 |
| JP | 6312674 B2 | 4/2018 |
| JP | 2020-42878 A | 3/2020 |

* cited by examiner

*Primary Examiner* — David Lam
(74) *Attorney, Agent, or Firm* — White & Case LLP

(57) ABSTRACT

According to one embodiment, there is provided a semiconductor storage device including bit cells, a pair of bit lines, a word line, a write amplifier, a word line driver, and an assist timing control circuit. The pair of bit lines are electrically connected to the bit cells. The word line is electrically connected to the bit cells. The write amplifier is electrically connected to the pair of bit lines. The word line driver is electrically connected to the word line. The assist timing control circuit has an output side electrically connected to the write amplifier and the word line driver.

17 Claims, 8 Drawing Sheets

… (US 10,957,385 B2)

SEMICONDUCTOR STORAGE DEVICE WITH ASSIST TIMING CONTROL CIRCUIT

CROSS-REFERENCE TO RELATED APPLICATIONS

This application is based upon and claims the benefit of priority from Japanese Patent Application No. 2019-047497, filed on Mar. 14, 2019; the entire contents of which are incorporated herein by reference.

FIELD

Embodiments described herein relate generally to a semiconductor storage device.

BACKGROUND

In semiconductor memories such as a static random access memory (SRAM), assist control is performed to assist operations of bit cells in some cases. The assist control is demanded to be properly performed.

DETAILED DESCRIPTION

In general, according to one embodiment, there is provided a semiconductor storage device including bit cells, a pair of bit lines, a word line, a write amplifier, a word line driver, and an assist timing control circuit. The pair of bit lines are electrically connected to the bit cells. The word line is electrically connected to the bit cells. The write amplifier is electrically connected to the pair of bit lines. The word line driver is electrically connected to the word line. The assist timing control circuit has an output side electrically connected to the write amplifier and the word line driver.

Exemplary embodiments of a semiconductor storage device will be explained below in detail with reference to the accompanying drawings. The present invention is not limited to the following embodiments.

EMBODIMENTS

A semiconductor storage device according to an embodiment is, for example, a static random access memory (SRAM), and includes a plurality of bit cells. Power is continuously supplied to each of the plurality of bit cells to hold data. In this context, low power consumption and low voltage operation may be required. When the power supply potential to each bit cell is lowered, data might be destroyed as a result of reading data from each bit cell, or data might be difficult to write to each bit cell.

Figure 1:
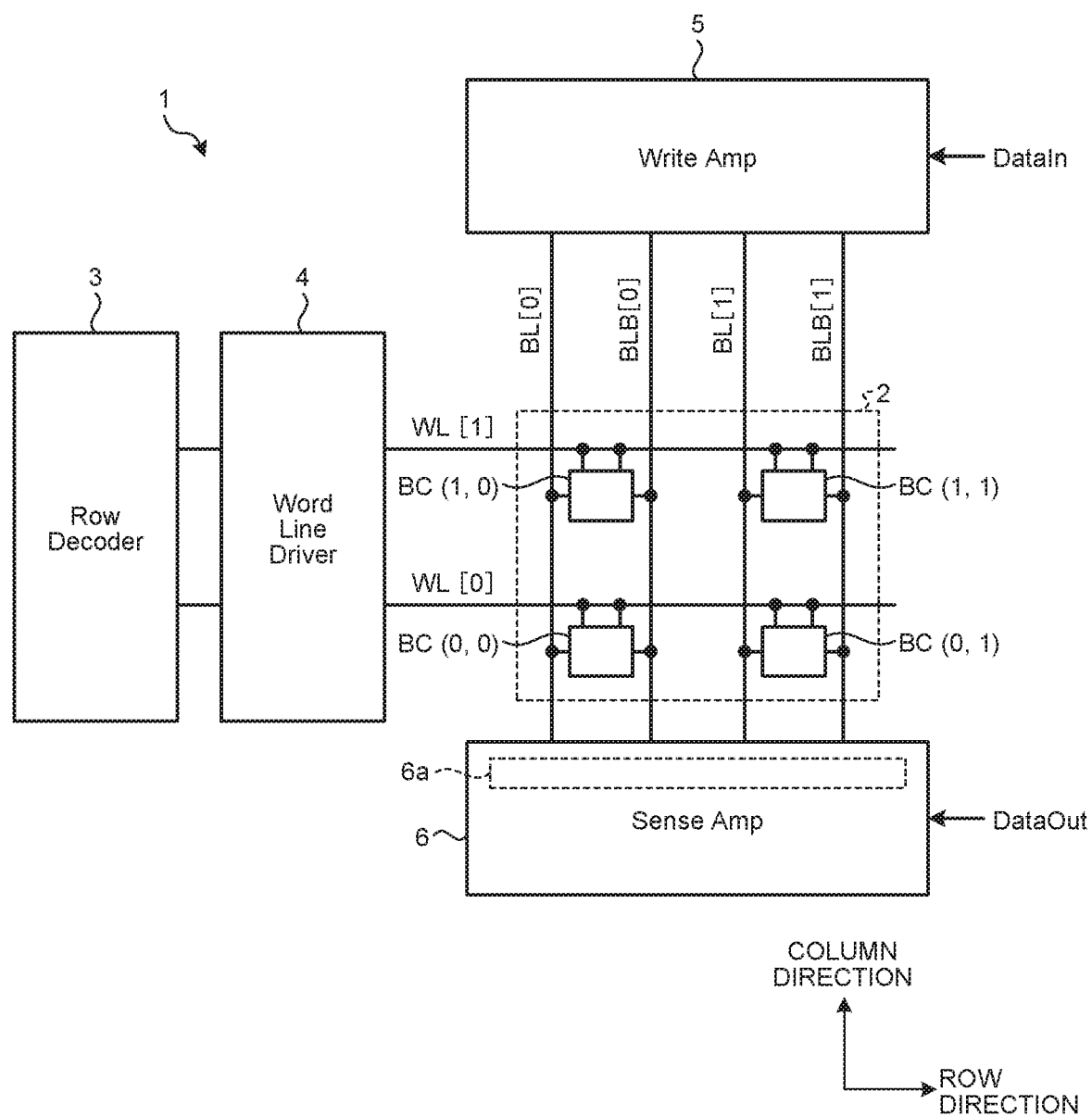
FIG. 1 is a diagram illustrating a configuration of a bit cell array and a part of peripheral circuits according to an embodiment.

Specifically, the semiconductor storage device 1 can be configured as illustrated in FIG. 1. FIG. 1 is a diagram illustrating a configuration of a bit cell array 2 and a part of peripheral circuits in the semiconductor storage device 1. Semiconductor storage device includes the bit cell array 2, a plurality of word lines WL[0] and WL[1], a plurality of pairs of bit lines (BL[0], BLB[0]) and (BL[1], BLB[1]), a row decoder (Row Decoder) 3, a word line driver (Word Line Driver) 4, a write amplifier (Write Amp.) 5, and a sense amplifier (Sense Amp.) 6. FIG. 1 illustrates an example where the bit cell array 2 includes bit cells BC (0,0) to BC (1,1) in 2 (row)×2 (column) arrangement for simplification of the drawing.

The row decoder 3 and the word line driver 4 are connected to the plurality of bit cell bit cells BC (0,0) to BC (1,1) through the plurality of word lines WL[0] and WL[1]. The plurality of word lines WL[0] and WL[1] extend in a row direction and are arranged in a column direction. Each of the word lines WL is commonly connected to bit cells BC in the same row. The word line WL[0] is commonly connected to the bit cells BC (0,0) and BC (0,1). The word line WL[1] is commonly connected to the bit cells BC (1,0) and BC (1,1).

The write amplifier 5 and the sense amplifier 6 are connected to the plurality of bit cells BC (0,0) to BC (1,1) through the plurality of pairs of bit lines (BL[0], BLB[0]) and (BL[1], BLB[1]).

The plurality of pairs of bit lines (BL[0], BLB[0]) and (BL[1], BLB[1]) extend in the column direction and are arranged in the row direction. Each of the pairs of bit lines BL and BLB is commonly connected to bit cells BC in the same column. The pair of bit lines BL[0] and BLB[0] are commonly connected to the bit cells BC (1,0) and BC (0,0). The pair of bit lines BL[1] and BLB[1] are commonly connected to the bit cells BC (1,1) and BC (0,1).

Figure 2:
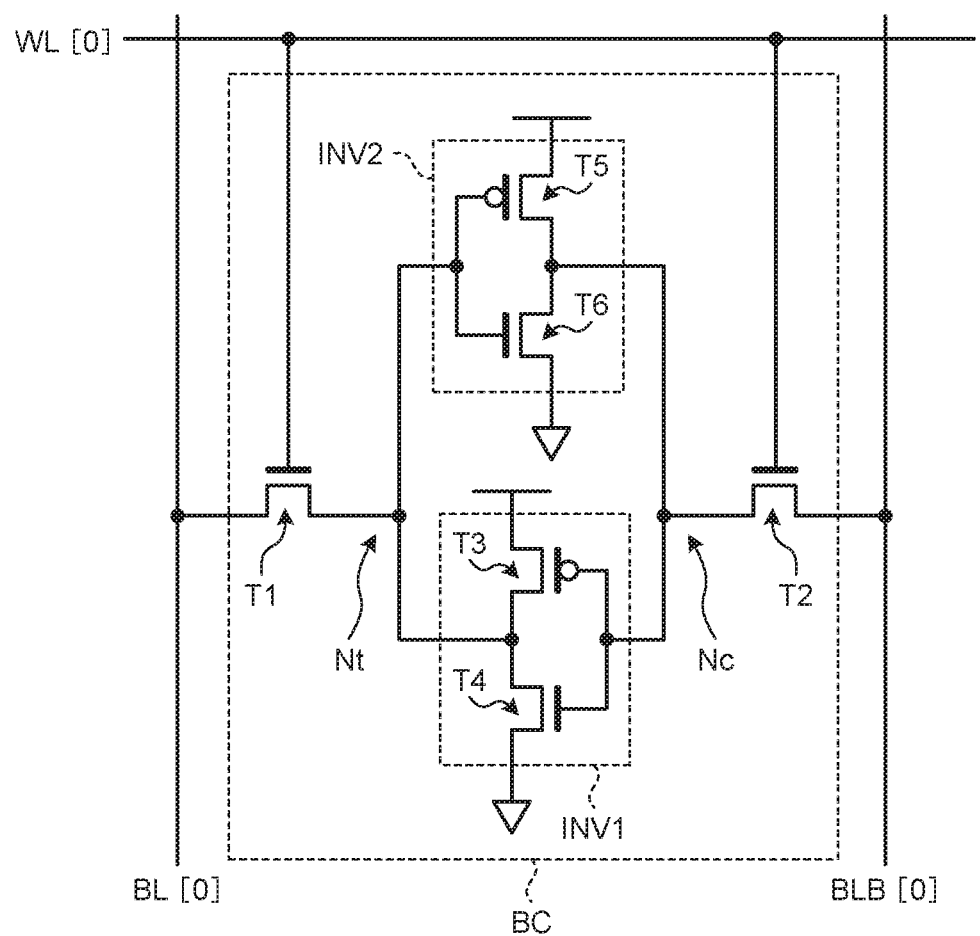
FIG. 2 is a diagram illustrating a configuration of a bit cell according to the embodiment.

Each of the bit cells BC is configured as illustrated in FIG. 2. FIG. 2 illustrates an example of a configuration of the bit cell BC (0,0), which is the same as the configurations of the other bit cells BC (0,1) to BC (1,1).

The bit cell BC (0,0) is a six-transistor SRAM cell including load transistors T3 and T5, drive transistors T4 and T6, and transfer transistors T1 and T2. The load transistor T3 and the drive transistor T4 form an inverter INV1, and the load transistor T5 and the drive transistor T6 form an inverter INV2. The inverter INV1 has an output terminal connected to an input terminal of the inverter INV2 through an inversion storage node Nc, and the inverter INV2 has an output terminal connected to an input terminal of the inverter INV1 through a storage node Nt. The inverter INV1 and the inverter INV2 form a flip flop.

The transfer transistor T1 is connected between the storage node Nt of the flip flop and the bit line BL. The transfer transistor T2 is connected between the inversion storage node Nc of the flip flop and the inversion bit line BLB. Each of the transfer transistors T1 and T2 is turned ON when a control signal at an active level is supplied from the word line driver 4 to the word line WL. Thus, the storage node Nt and inversion storage node Nc are electrically connected to the bit line BL and the inversion bit line BLB, respectively.

An example of the bit cell BC is described in which the storage node Nt holds L level and the inversion storage node Nc holds H level. In a read operation, when the transfer transistors T1 and T2 are turned ON, the data held by the storage nodes Nt and Nc are transferred to the bit line BL and the inversion bit line BLB. Thus, the data held by a memory cell MC is read out to a column decoder 6a in the sense amplifier 6 via the bit line BL and the inversion bit line BLB. The sense amplifier 6 detects data of the column selected by the column decoder 6a and outputs the data as output data DataOut.

In this process, when the power supply potential to the bit cell BC is lowered, H level and L level determination potentials are also lowered. Accordingly, when the transfer transistors T1 and T2 are turned ON, charges that may move from the bit line BL and the inversion bit line BLB to the storage node Nt and the inversion storage node Nc might result in logical inversion of the potential of the storage node Nt and/or the inversion storage node Nc. Specifically, the data held by the storage node Nt and/or the inversion storage node Nc may be destroyed.

Figure 3:
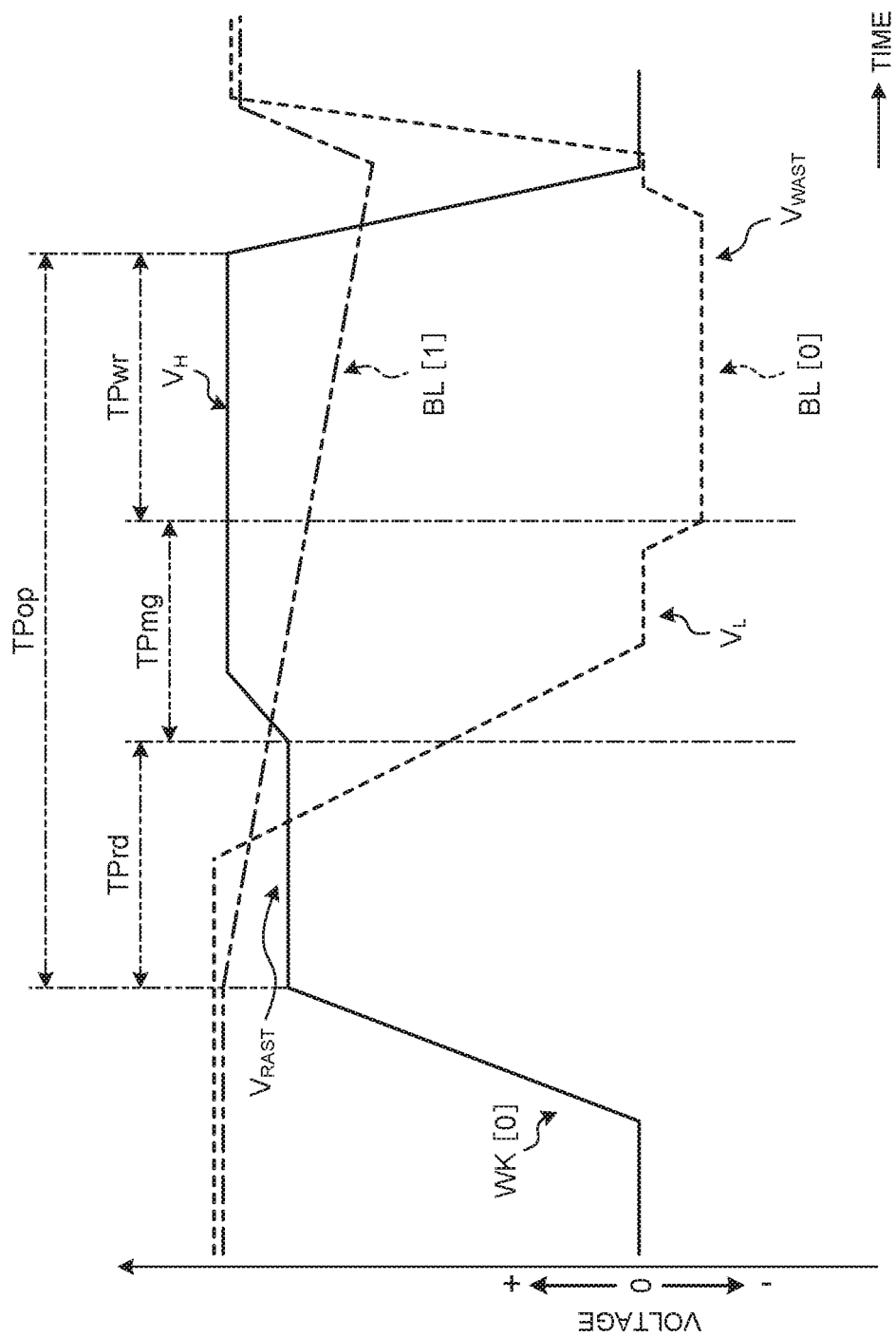
FIG. 3 is a waveform diagram illustrating timing of an assist operation according to the embodiment.

On the other hand, as illustrated in FIG. 3, the word line driver 4 performs a read assist operation in a read operation period TPrd. The read assist operation is an operation for preventing the data held by the bit cell BC from being destroyed, and includes operations such as lowering the drive capability of the transfer transistors T1 and T2. FIG. 3 is a waveform diagram illustrating timing of the assist operation.

In the read operation period TPrd, the word line driver 4 controls the level of a control signal, supplied to the word line WL, to be at a read assist level $V_{RAST}$ (for example, 1.0 V) lower than a high level $V_H$ (for example, 1.2 V). As a result, the gate voltage of the transfer transistors T1 and T2 is suppressed to a low level, and thus the drive capability of the transfer transistors T1 and 12 decreases. Thus, the movement of charges from the bit line BL and the inversion bit line BLB to the storage node Nt and the inversion storage node Nc is restricted, so that the potential of the storage node Nt and/or the inversion storage node Nc is less likely to be logically inverted. Thus, the data held by the storage node Nt and/or the inversion storage node Nc can be prevented from being destroyed.

For example, in a write operation, when the transfer transistors T1 and T2 are turned ON, data (voltage) supplied from the write amplifier 5 to the bit line BL and the inversion bit line BLB is transferred to the storage nodes Nt and Nc. Thus, the potential levels corresponding to data are written to the storage nodes Nt and Nc.

In this process, when the power supply potential to the bit cell BC is lowered, the gate voltage of the transfer transistors T1 and T2 is lowered. Accordingly, when the data in the bit cell BC is rewritten, the amount of charges that may move from the bit line BL and the inversion bit line BLB to the storage node Nt and the inversion storage node Nc might be smaller than the amount required for logically inverting the potential of the storage nodes Nt and Nc. Thus, it may be difficult to write data with different levels to the storage node Nt and the inversion storage node Nc.

On the other hand, as illustrated in FIG. 3, the write amplifier 5 performs the write assist operation in a write operation period TPwr. The write assist operation is an operation for assisting the rewriting of data in the bit cell BC, and includes operations such as enhancing the drive capability of the transfer transistors T1 and T2.

In the write operation period TPwr, the write amplifier 5 controls a potential level, supplied to the bit line BL, to be at a write assist level $V_{WAST}$ (for example, −0.2 V) lower than a low level $V_L$ (for example, 0 V). As a result, gate-source voltage of the transfer transistors T1 and T2 increases, so that the drive capability of the transfer transistors T1 and 12 increases. Thus, the movement of charges from the bit line BL and the inversion bit line BLB to the storage node Nt and the inversion storage node Nc is promoted, so that the logical inversion of the potential of the storage node Nt and/or the inversion storage node Nc is facilitated. Thus, the writing of data with different levels to the storage node Nt and the inversion storage node Nc is facilitated.

In order to achieve a higher operation speed of the semiconductor storage device 1, it is effective to sequentially perform the read operation and the write operation. When the voltage of each bit cell BC is lowered, the semiconductor storage device 1 performs the read assist operation during the read operation period and performs the write assist operation during the write operation period. Furthermore, when the control signal at the active level is supplied to the word line of the selected bit cell BC, the transfer transistors T1 and T2 of a non-selected bit cell BC sharing the word line are also turned ON so that a readable state is established. Thus, the read assist operation may be performed in the first half of the write operation period and the write assist operation may be performed in the later half of the write operation period.

The control in the read assist operation and the control in the write assist operation may be in opposite directions. Specifically, the control in the read assist operation is performed to lower the drive capability of the transfer transistors T1 and T2 of the bit cell BC, whereas the control in the write assist operation is performed to enhance the drive capability of the transfer transistors T1 and T2 of the bit cell BC. Thus, when the read assist operation period and the write assist operation period overlap (that is, when the start timing of the write operation is earlier than the completion timing of the read operation), malfunction may occur in the read operation and/or the write operation. For example, in the semiconductor storage device 1, when the timing of the read assist operation and/or the write assist operation is separately controlled, the read assist operation period and the write assist operation period may overlap with each other due to shifting of the timings as a result of variations in circuit elements due to manufacturing processes or variations in the operating environment such as voltage and temperature.

In view of this, as illustrated in FIG. 3, if a long margin period TPmg is provided between the completion timing of the read assist operation and the start timing of the write assist operation, the read assist operation and the write assist operation can be prevented from interfering with each other. Still, this may lead to a longer operation period TPop (=TPrd+TPmg+TPwr) of one bit cell BC. As a result, it may be difficult to achieve a higher operation speed of the semiconductor storage device 1.

Therefore, in the present embodiment, in the semiconductor storage device 1, a higher operation speed of the semiconductor storage device 1 is achieved with control performed using the later one of the signal instructing the completion of the read assist operation and the signal instructing the start of the write assist operation, so that completion of the read assist operation and start of the write assist operation occur in this order.

Figure 4:
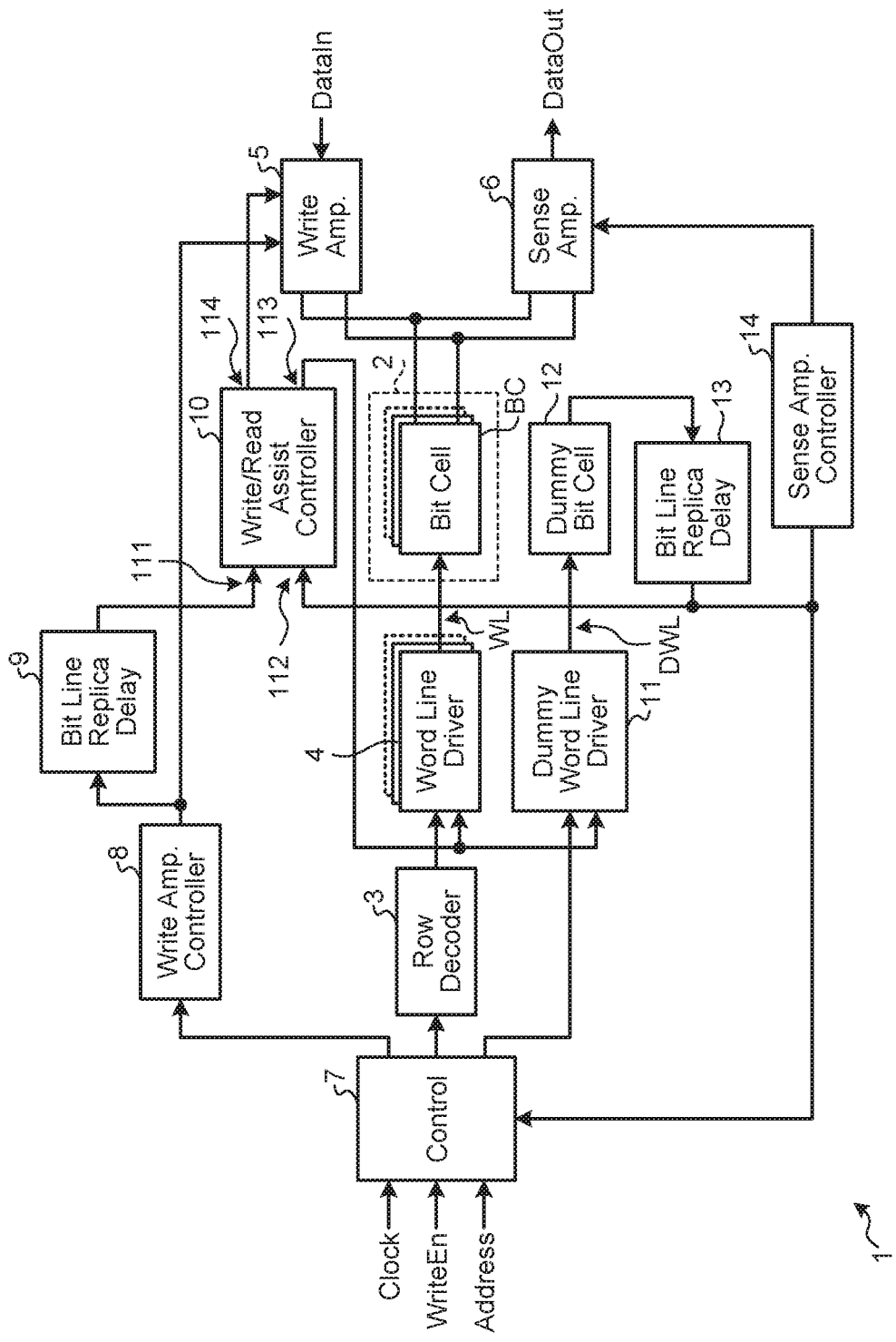
FIG. 4 is a diagram illustrating a configuration of a semiconductor storage device according to the embodiment.

Specifically, as illustrated in FIG. 4, the semiconductor storage device 1 further includes a main control circuit (Control) 7, a write amplifier control circuit (Write Amp.

Controller) 8, a replica delay circuit (Bit Line Replica Delay) 9, an assist timing control circuit (Write/Read Assist Controller) 10, a dummy word line driver (Dummy Word Line Driver) 11, a dummy bit cell (Dummy Bit Cell) 12, a replica delay circuit (Bit Line Replica Delay) 13, and a sense amplifier control circuit (Sense Amp. Controller) 14. FIG. 4 is a diagram illustrating a configuration of the semiconductor storage device 1.

The main control circuit 7 receives a clock 'Clock', a write enable signal 'WriteEn', and an address signal 'Address' from the outside (for example, an upper level controller). The write amplifier control circuit 8 is electrically connected between the main control circuit 7 and 'the replica delay circuit 9'/'the write amplifier 5'. The replica delay circuit 9 is electrically connected between the write amplifier control circuit 8 and the assist timing control circuit 10.

The row decoder 3 is electrically connected between the main control circuit 7 and the word line driver 4. The word line driver 4 is electrically connected between the row decoder 3 and the bit cell array 2. The bit cell array 2 is electrically connected between the word line driver 4 and 'the write amplifier 5'/'the sense amplifier 6'. The sense amplifier control circuit 14 is electrically connected between the main control circuit 7 and the sense amplifier 6.

The dummy word line driver 11 is electrically connected between the main control circuit 7 and the dummy bit cell 12. The dummy word line driver 11 is electrically connected to the dummy bit cell 12 through the dummy word line DWL. The dummy bit cell 12 is electrically connected between the dummy word line driver 11 and the replica delay circuit 13. The replica delay circuit 13 is electrically connected between the dummy bit cell 12 and the assist timing control circuit 10.

The assist timing control circuit 10 includes the replica delay circuit 9, the replica delay circuit 13, the word line driver 4, the dummy word line driver 11, and the write amplifier 5. The assist timing control circuit 10 has an input node 111 electrically connected to the replica delay circuit 9, an input node 112 electrically connected to the replica delay circuit 13, an output node 113 electrically connected to each of the word line driver 4 and the dummy word line driver 11, and an output node 114 electrically connected to the write amplifier 5.

Figure 5:
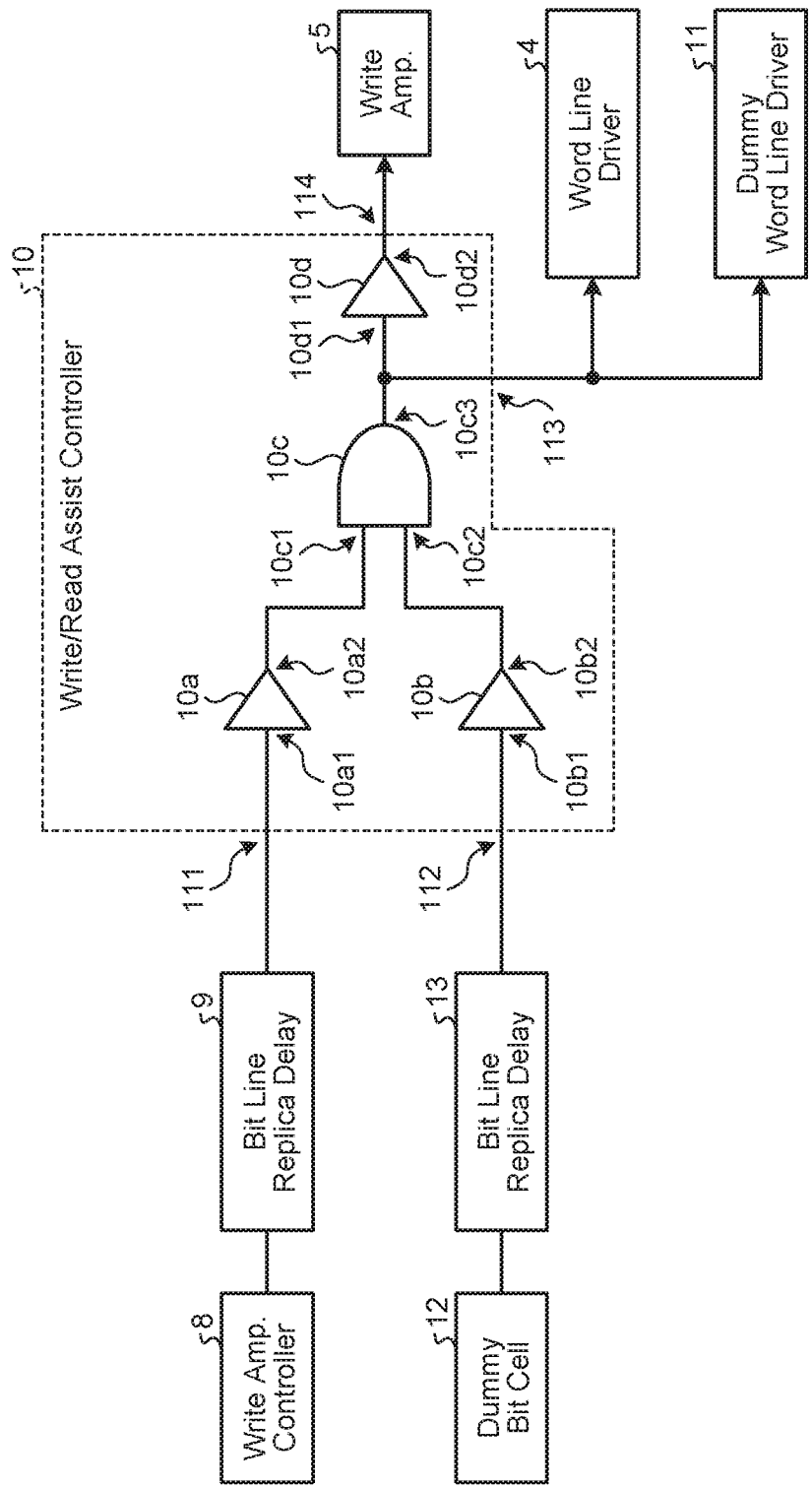
FIG. 5 is a diagram illustrating a configuration of an assist timing control circuit according to the embodiment.

The assist timing control circuit 10 can be configured, for example, as illustrated in. FIG. 5 FIG. 5 is a diagram illustrating a configuration of the assist timing control circuit 10.

The assist timing control circuit 10 includes a delay element 10*a*, a delay element 10*b*, an AND circuit 10*c*, and a delay element 10*d*. Delay amounts of the delay element 10*a*, the delay element 10*b*, and the delay element 10*d* may be the same. The delay element 10*a* has an input node 10*a*1 electrically connected to the input node 111. The delay element 10*b* has an input node 10*b*1 electrically connected to the input node 112. The AND circuit 10*c* has an input node 10*c*1 electrically connected to an output node 10*a*2 of the delay element 10*a*, an input node 10*c*2 electrically connected to an output node 10*b*2 of the delay element 10*b*, and an output node 10*c*3 electrically connected to each of an input node 10*d*1 of the delay element 10*d* and the output node 113. The delay element 10*d* has an output node 10*d*2 electrically connected to the output node 114.

Figure 6A:
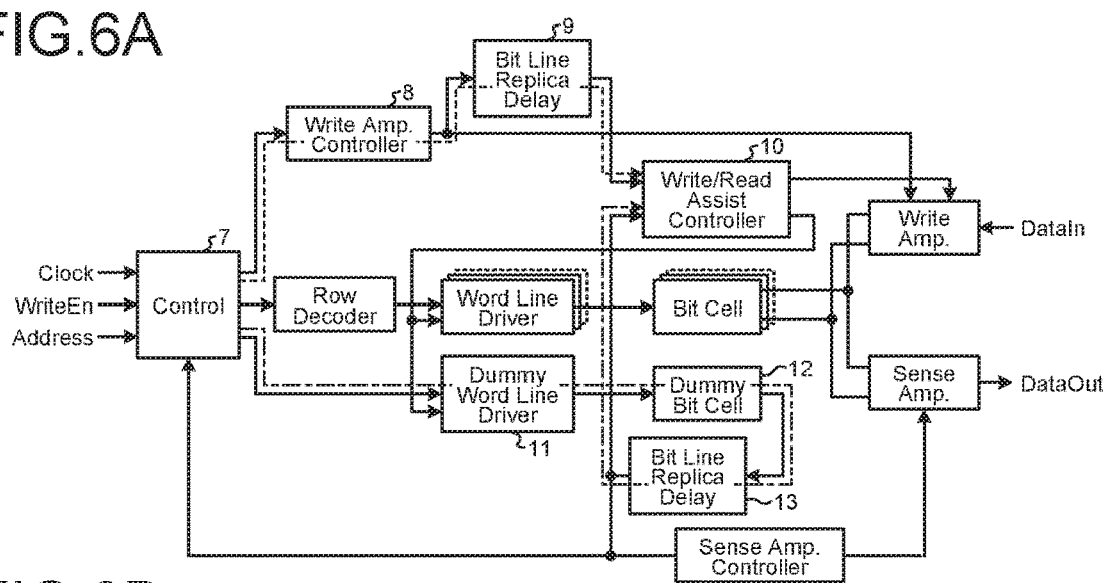
FIGS. 6A to 6C are diagrams illustrating an operation of the semiconductor storage device according to the embodiment.
Figure 6B:
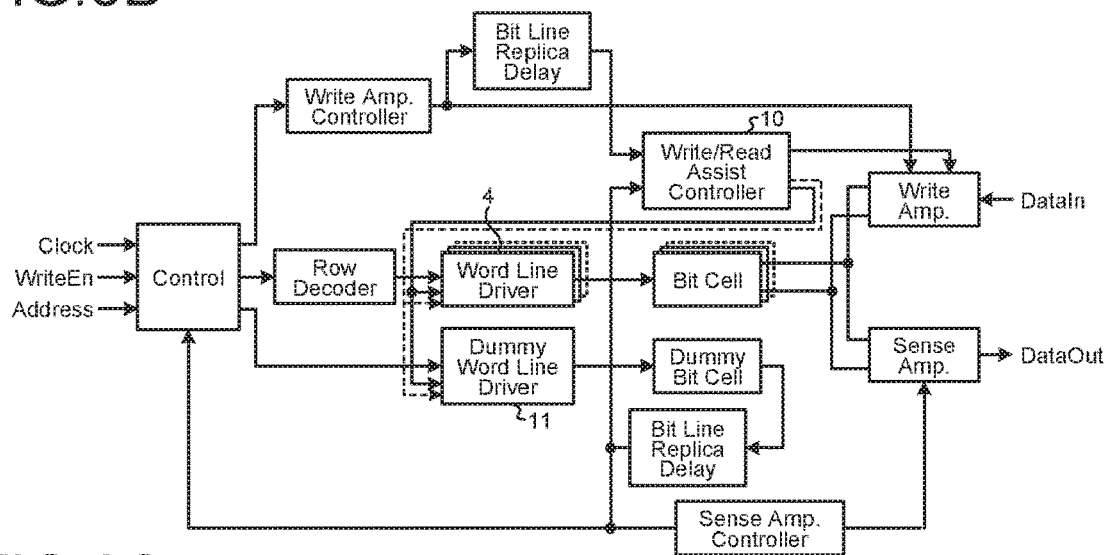
Figure 6C:
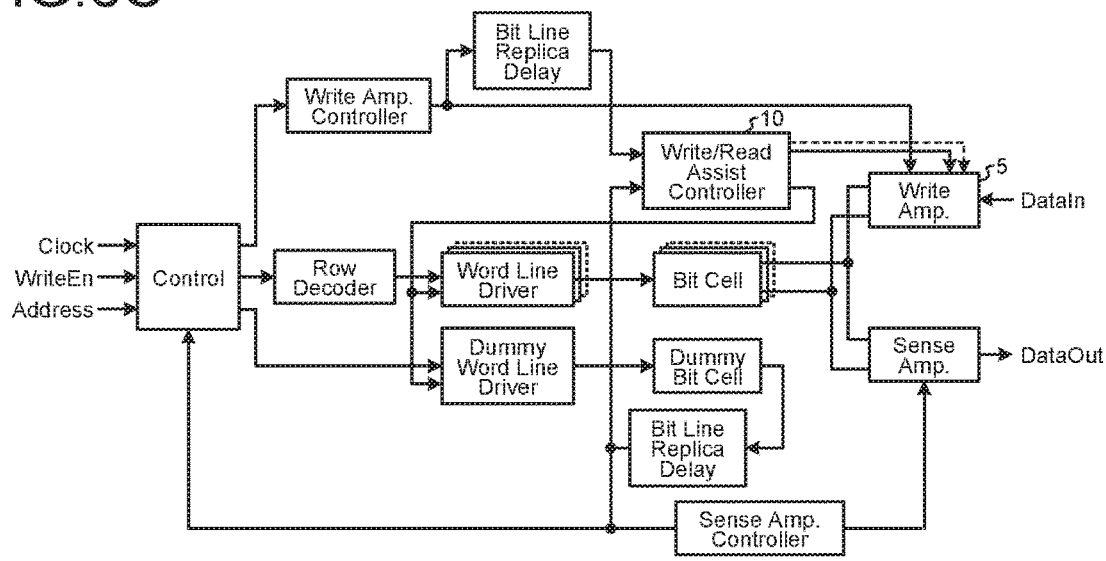

Next, operations of the semiconductor storage device 1 will be described with reference to FIGS. 6A to 6C. FIGS. 6A to 6C are diagrams illustrating the operations of the semiconductor storage device 1. The semiconductor storage device 1 sequentially performs the operations illustrated in FIGS. 6A, 6B, and 6C.

Upon determining that the read assist operation is to be completed, the main control circuit 7 supplies a control signal (read assist completion instruction signal) for instructing the completion of the read assist operation, to the assist timing control circuit 10 via the dummy word line driver 11, the dummy bit cell 12, and the replica delay circuit 13, as indicated by an arrow with a dashed-dotted line in FIG. 6A. Furthermore, upon determining that the write assist operation is to be started, the main control circuit 7 supplies a control signal (write assist start instruction signal) for instructing the start of the write assist operation, to the assist timing control circuit 10 via the write amplifier control circuit 8 and the replica delay circuit 9, as indicated by an arrow with a dotted line in FIG. 6A.

As indicated by a dotted line in FIG. 6B, the assist timing control circuit 10 supplies a read assist control signal for controlling the completion of the read assist operation, to each of the word line driver 4 and the dummy word line driver 11, in response to the later one of the read assist completion instructing signal and the write assist start instructing signal. Thus, the word line driver 4 and the dummy word line driver 11 each complete the read assist operation. For example, the word line driver 4 and the dummy word line driver 11 change the level of the control signal, supplied to the selected word line WL and the selected dummy word line, from the read assist level $V_{RAST}$ to the high level $V_H$ (see FIG. 3).

Thereafter, as indicated by a dotted line in FIG. 6C, the assist timing control circuit 10 supplies a write assist control signal for controlling the start of the write assist operation, to the write amplifier 5. Thus, the write amplifier 5 starts the write assist operation. For example, the write amplifier 5 changes the potential level supplied to the selected bit line BL from the low level $V_L$ to the write assist level $V_{WAST}$ (see FIG. 3).

In the semiconductor storage device 1, the delay amounts of the replica delay circuit 9 and the replica delay circuit 13 may vary due to variations in circuit elements due to manufacturing processes and variations in the operating environment such as voltage and temperature. In view of this, the assist timing control circuit 10 performs control to complete the read assist operation, triggered by one of the read assist completion instruction signal and the write assist start instruction signal that is at a later timing, and performs control to start the write assist operation, by using a control signal delayed from the control signal by a delay amount corresponding to a single stage of a delay element, for example. Thus, the control can be performed so that the "completion of the read assist operation" and the "start of the write assist operation" can be guaranteed to be performed in this order in terms of timing, as illustrated in FIGS. 6A to 6C.

As described above, in the present embodiment, in the semiconductor storage device 1, control is performed using the later one of the signal instructing the completion of the read assist operation and the signal instructing the start of the write assist operation, so that the completion of the read assist operation and the start of the write assist operation occur in this order. Thus, higher speed operation of the semiconductor storage device 1 can be achieved by preventing the read assist operation and the write assist operation from interfering with each other. Thus, the write operation and the read operation can be stably performed under low voltage without compromising the operation speed, even when the circuit elements vary due to manufacturing processes or the operation environment (such as voltage and temperature) varies.

Note that the write assist control signal for controlling the start of the write assist operation may be generated by using a signal generated as a result of detection of the potential of the dummy word line rising to the H level and a signal which is the write assist signal after passing through the replica delay, instead of using the read assist signal after passing through the replica delay.

Figure 7:
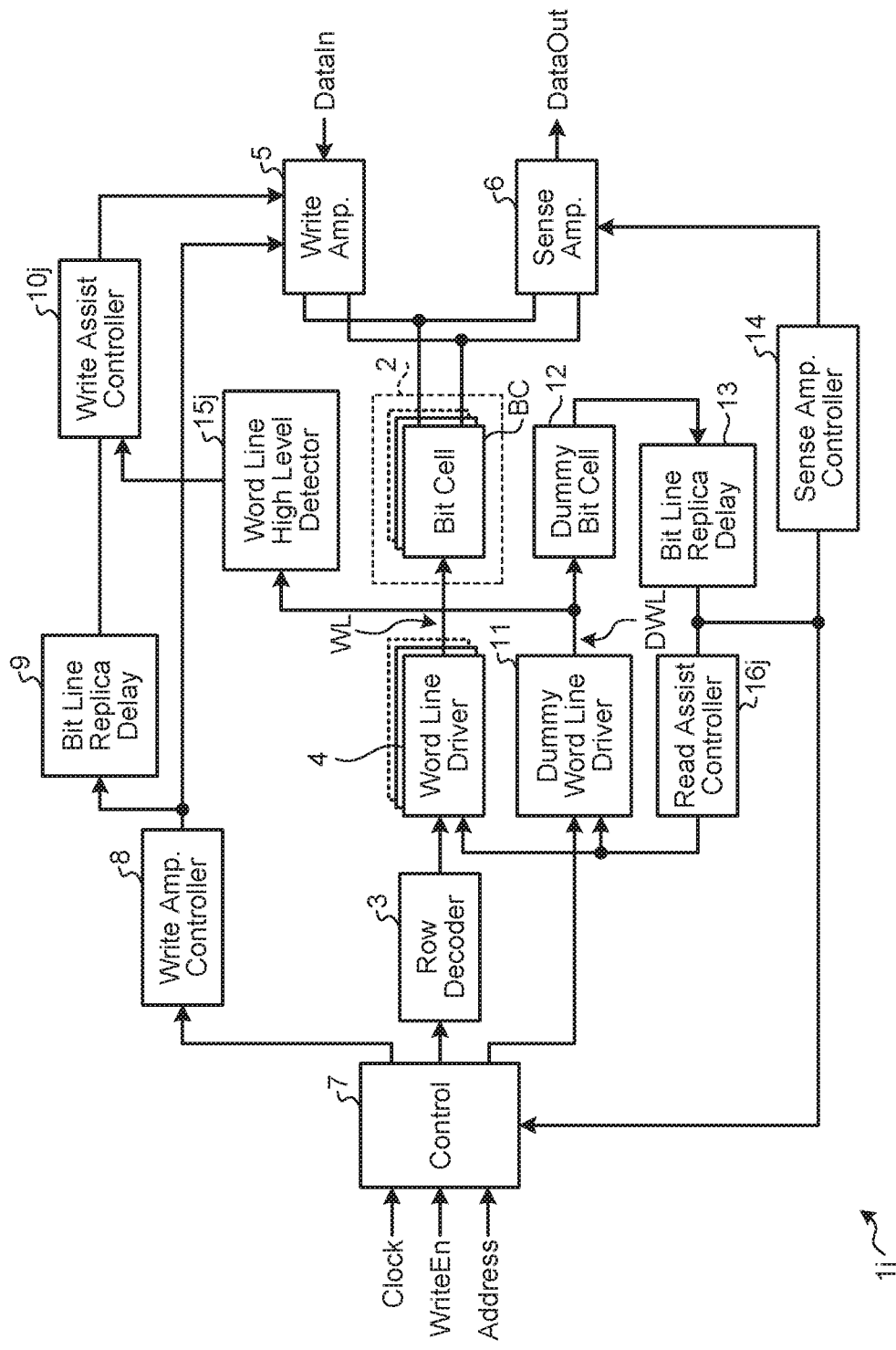
FIG. 7 is a diagram illustrating a configuration of a semiconductor storage device according to a modification of the embodiment.

For example, a semiconductor storage device 1j configured as illustrated in FIG. 7 may be employed. FIG. 7 is a diagram illustrating a configuration of the semiconductor storage device 1j according to a modification of the embodiment. The semiconductor storage device 1j includes an assist timing control circuit (Read Assist Controller) 16j and an assist timing control circuit (Write Assist Controller) 10j in place of the assist timing control circuit 10 (see FIG. 4), and further includes a word line voltage detection circuit (Word Line High Level Detector) 15j. The assist timing control circuit 16j is electrically connected between the replica delay circuit 13 and the word line driver 4/the dummy word line driver 11. The assist timing control circuit 10j is electrically connected between the replica delay circuit 9 and the write amplifier 5. The word line voltage detection circuit 15j is electrically connected between the dummy word line driver 11/the dummy bit cell 12 and the assist timing control circuit 10j. Thus, the word line voltage detection circuit 15j is electrically connected to the dummy word line.

Figure 8A:
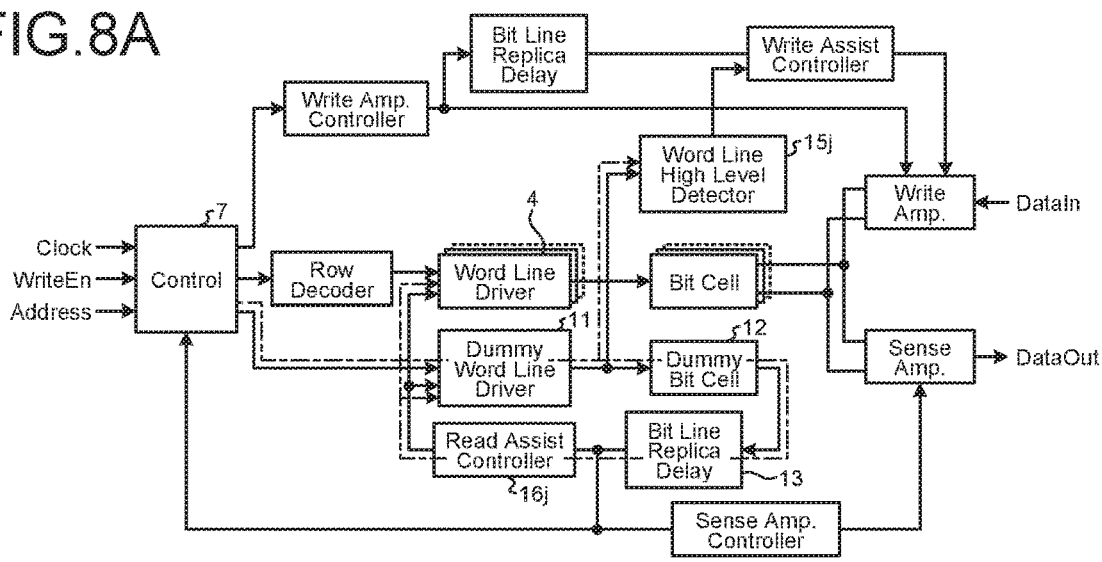
FIGS. 8A to 8C are diagrams illustrating an operation of the semiconductor storage device according to the modification of the embodiment.
Figure 8B:
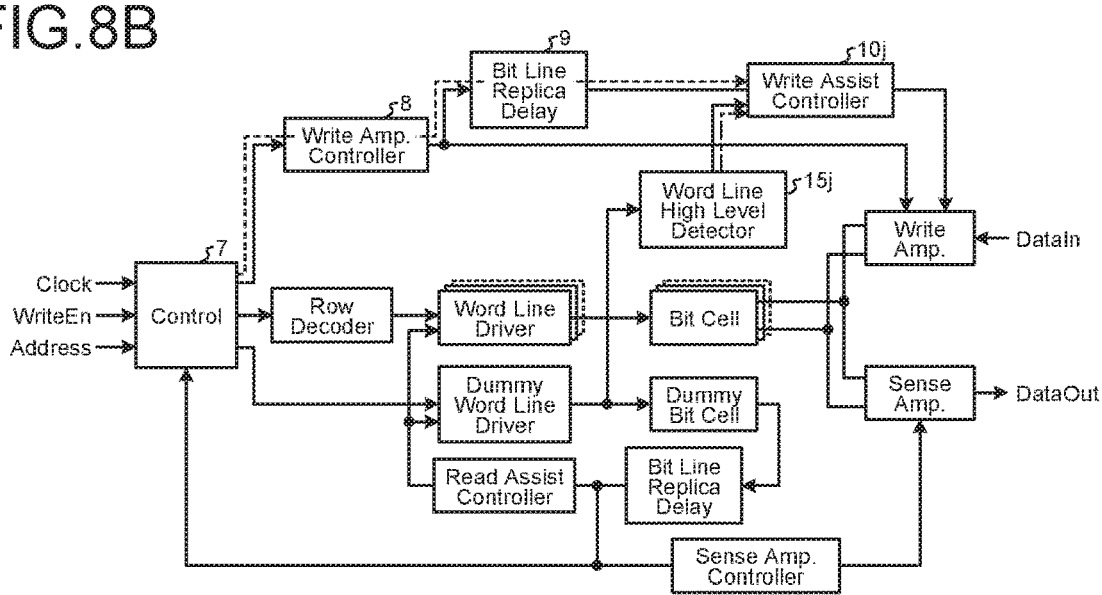
Figure 8C:
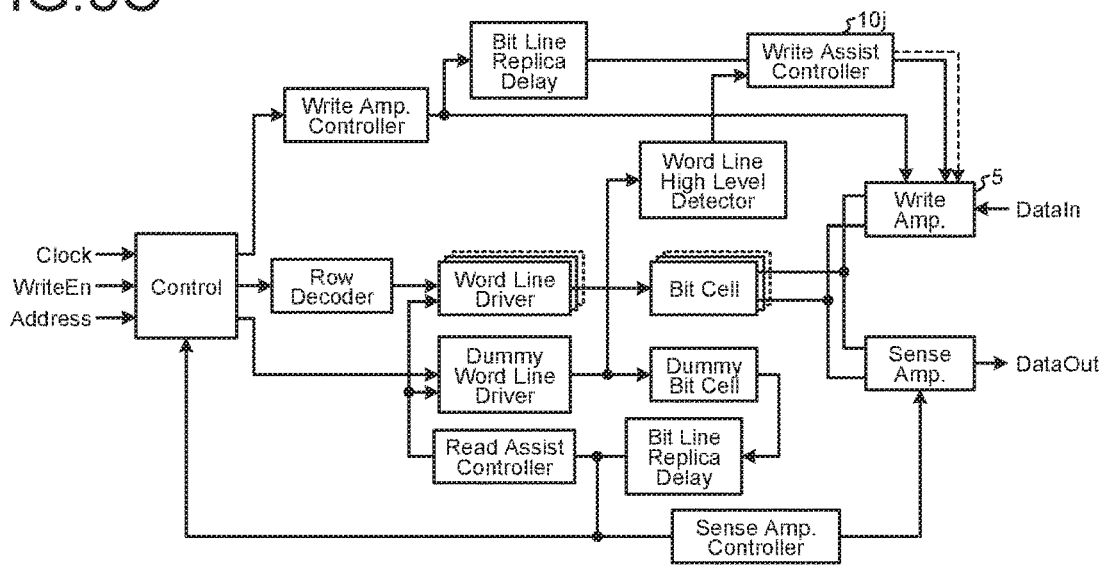

The semiconductor storage device 1j performs operations as illustrated in FIGS. 8A to 8C. FIGS. 8A to 8C are diagrams illustrating the operations of the semiconductor storage device 1j. The semiconductor storage device 1j sequentially performs the operations illustrated in FIGS. 8A, 8E, and 8C.

Upon determining that the read assist operation is to be completed, the main control circuit 7 supplies a control signal (read assist completion instruction signal) for instructing the completion of the read assist operation, to the word line driver 4 and the dummy word line driver 11, through the dummy word line driver 11, the dummy bit cell 12, the replica delay circuit. 13, and the timing control circuit 16j, as indicated by an arrow with a dashed-dotted line in FIG. 8A. Thus, the word line driver 4 and the dummy word line driver 11 each complete the read assist operation. For example, the word line driver 4 and the dummy word line driver 11 change the level of the control signal, supplied to the selected word line WL and the selected dummy word line, from the read assist level $V_{RAST}$ to the high level $V_H$ (see FIG. 3). In response to this, the word line voltage detection circuit 15j detects that the level or the control signal supplied to the selected dummy word line has changed from the read assist level $V_{RAST}$ to the high level $V_H$.

Furthermore, upon determining that the write assist operation is to be started, the main control circuit 7 supplies a control signal (write assist start instruction signal), for instructing the start of the write assist operation, to the assist timing control circuit 10j via the write amplifier control circuit 8 and the replica delay circuit 9, as indicated by an arrow with a dotted line in FIG. 8B. Furthermore, as indicated by an arrow with a dotted chain line in FIG. 8B, the word line voltage detection circuit 15j supplies a level change detection signal indicating that the level of the control signal supplied to the selected dummy word line has changed from the read assist level $V_{RAST}$ to the high level $V_H$, to the assist timing control circuit 10j.

As indicated by a dotted line in FIG. 8C, the assist timing control circuit 10j supplies a write assist control signal for controlling the start of the write assist operation start, to the write amplifier 5, in response to a later one of the level change detection signal and the write assist start instruction signal. Thus, the write amplifier 5 starts the write assist operation. For example, the write amplifier 5 changes the potential level supplied to the selected bit line BL from the low level $V_L$ to the write assist level $V_{WAST}$ (see FIG. 3).

In this way, higher speed operation of the semiconductor storage device 1j can be achieved by preventing the read assist operation and the write assist operation from interfering with each other, by generating the write assist control signal by using a signal generated as a result of detection of the potential of the dummy word line rising to the H level and a signal which is the write assist signal after passing through the replica delay (by calculating the logical AND of these, for example).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   bit cells;
   a pair of bit lines electrically connected to the bit cells;
   a word line electrically connected to the bit cells;
   a write amplifier electrically connected to the pair of bit lines;
   a word line driver electrically connected to the word line; and
   an assist timing control circuit having an output side electrically connected to the write amplifier and the word line driver, wherein
   the assist timing control circuit supplies a first assist control signal to the word line driver at a first timing, and supplies a second assist control signal to the write amplifier at a second timing later than the first timing.

2. The semiconductor storage device according to claim 1, wherein
   the word line driver causes a read assist operation to be completed in response to the first assist control signal, and
   the write amplifier causes a write assist operation to be started in response to the second assist control signal.

3. The semiconductor storage device according to claim 1 further comprising:
   a first delay circuit electrically connected to an input side of the assist timing control circuit; and
   a second delay circuit electrically connected to the input side of the assist timing control circuit.

4. The semiconductor storage device according to claim 3, wherein
   the assist timing control circuit includes an AND circuit including a first input node electrically connected to the first delay circuit, a second input node electrically connected to the second delay circuit, and a first output node electrically connected to the word line driver.

5. The semiconductor storage device according to claim 4, wherein
the assist timing control circuit further includes
a delay element including an input node electrically connected to the first output node and an output node electrically connected to the write amplifier.

6. The semiconductor storage device according to claim 1 further comprising:
a first delay circuit electrically connected to an input side of the assist timing control circuit, the first delay circuit supplying a first signal to the assist timing control circuit, the first signal corresponding to the first assist control signal; and
a second delay circuit electrically connected to the input side of the assist timing control circuit, the second delay circuit supplying a second signal to the assist timing control circuit, the second signal corresponding to the second assist control signal.

7. The semiconductor storage device according to claim 6, wherein
the assist timing control circuit includes
an AND circuit including a first input node electrically connected to the first delay circuit, a second input node electrically connected to the second delay circuit, and a first output node electrically connected to the word line driver.

8. The semiconductor storage device according to claim 7, wherein
the assist timing control circuit further includes
a delay element including an input node electrically connected to the first output node and an output node electrically connected to the write amplifier.

9. The semiconductor storage device according to claim 1, wherein
the assist timing control circuit supplies the first assist control signal to the word line driver, in response to a later one of a first signal and a second signal, each of the first signal and the second signal being a signal supplied to the assist timing control circuit, the first signal corresponding to the first assist control signal, the second signal corresponding to the second assist control signal.

10. The semiconductor storage device according to claim 1, wherein
the assist timing control circuit delays the first assist control signal to generate the first assist control signal, and supplies the first assist control signal to the word line driver.

11. A semiconductor storage device comprising:
bit cells;
a pair of bit lines electrically connected to the bit cells;
a word line electrically connected to the bit cells;
a write amplifier electrically connected to the pair of bit lines;
a word line driver electrically connected to the word line; and
an assist timing control circuit having an output side electrically connected to the write amplifier and the word line driver, wherein
the assist timing control circuit includes
an AND circuit including a first output node electrically connected to the word line driver, and
a delay element including an input node electrically connected to the first output node and an output node electrically connected to the write amplifier, and
the AND circuit further includes
a first input node that receives a first signal corresponding to a first assist control signal, and
a second input node that receives a second signal corresponding to a second assist control signal.

12. The semiconductor storage device according to claim 11, wherein
the assist timing control circuit includes a delay element, and causes the first assist control signal to be input to the delay element at the first timing, and causes the second assist control signal to be output from the delay element at the second timing.

13. The semiconductor storage device according to claim 12, wherein
the assist timing control circuit further includes
an AND circuit including a first input node that receives the first signal corresponding to the first assist control signal, a second input node that receives the second signal corresponding to the second assist control signal, and a first output node that outputs the first assist control signal.

14. A semiconductor storage device comprising:
bit cells;
a pair of bit lines electrically connected to the bit cells;
a word line electrically connected to the bit cells;
a write amplifier electrically connected to the pair of bit lines;
a word line driver electrically connected to the word line;
a word line voltage detection circuit;
an assist timing control circuit having an input side electrically connected to the word line voltage detection circuit and an output side electrically connected to the write amplifier;
dummy bit cells;
a dummy word line electrically connected to the dummy bit cells; and
a dummy word line driver electrically connected to the dummy word line, wherein
the word line voltage detection circuit is electrically connected to the dummy word line.

15. The semiconductor storage device according to claim 14, wherein
the assist timing control circuit supplies an assist control signal to the write amplifier, in response to a signal received from the word line voltage detection circuit.

16. The semiconductor storage device according to claim 14 further comprising
a delay circuit electrically connected to the input side of the assist timing control circuit, wherein
the assist timing control circuit supplies an assist control signal to the word line driver in response to a later one of a signal received from the delay circuit and a signal received from the word line voltage detection circuit.

17. The semiconductor storage device according to claim 16, wherein
the assist timing control circuit generates the assist control signal by calculating a logical AND between the signal received from the delay circuit and the signal received from the word line voltage detection circuit.

* * * * *